United States Patent
Sridharan (10) Patent No.: US 6,570,452 B2
(45) Date of Patent: May 27, 2003

(54) FRACTIONAL-N TYPE FREQUENCY SYNTHESIZER

(75) Inventor: Kartik Sridharan, Jacksonville, FL (US)

(73) Assignee: Ashvattha Semiconductor, Inc., San Diego, CA (US)

( * ) Notice: Subject to any disclaimer, the term of this patent is extended or adjusted under 35 U.S.C. 154(b) by 0 days.

(21) Appl. No.: 09/966,205

(22) Filed: Sep. 26, 2001

(65) Prior Publication Data

US 2003/0058055 A1 Mar. 27, 2003

(51) Int. Cl.$^7$ ................................................ H03L 7/00
(52) U.S. Cl. ........................ 331/1 A; 327/105; 327/291
(58) Field of Search ............................ 331/1 A, 16, 17, 331/18, 50, 51, 52, 53; 377/48; 341/143; 327/105, 115, 116, 117, 119, 291, 299, 293, 294

(56) References Cited

U.S. PATENT DOCUMENTS

| 3,217,267 | A |   | 11/1965 | Loposer ...................... 331/16 |
| 4,609,881 | A |   | 9/1986  | Wells ........................ 331/1 A |
| 4,800,342 | A | * | 1/1989  | Jackson ....................... 331/10 |
| 5,038,117 | A |   | 8/1991  | Miller ......................... 331/16 |
| 5,311,181 | A | * | 5/1994  | Ferguson, Jr. et al. ...... 341/143 |
| 5,648,779 | A | * | 7/1997  | Cabler ....................... 341/143 |
| 5,949,361 | A | * | 9/1999  | Fischer et al. ............. 341/143 |
| 5,982,315 | A | * | 11/1999 | Bazarjani et al. ........... 341/143 |
| 6,121,910 | A | * | 9/2000  | Khoury et al. ............. 341/143 |
| 6,236,703 | B1 | * | 5/2001 | Riley .......................... 377/48 |
| 6,351,229 | B1 | * | 2/2002 | Wang ........................ 341/143 |
| 6,392,493 | B1 | * | 5/2002 | Minnis ....................... 331/1 A |
| 6,509,800 | B2 | * | 1/2003 | Stockton ..................... 331/11 |

OTHER PUBLICATIONS

Miller, et al., 1990, "A Multiple Modulator Fractional Divider," Forty–Fourth Annual Symposium on Frequency Control: *IEEE* p. 559–567.

Norsworthy, et al., "Delta–Sigma Data Converters: Theory, Design, and Simulation," The Institute of Electrical and Electronics Engineers, Inc., *IEEE Press* (1997), New York, pp. 22–23, 75–84, and 174–181.

\* cited by examiner

*Primary Examiner*—Timothy P. Callahan
*Assistant Examiner*—Hai L. Nguyen
(74) *Attorney, Agent, or Firm*—Pennie & Edmonds LLP (57) ABSTRACT

In a fractional-N frequency synthesizer, a circuit for generating at least one off-axis zero in an equation representative of the circuit.

11 Claims, 9 Drawing Sheets

PRIOR ART

FRACTIONAL-N TYPE FREQUENCY SYNTHESIZER

FIELD OF THE INVENTION

This relates to a fractional-N type frequency synthesizer.

BACKGROUND OF THE INVENTION

Frequency synthesizers generate an output signal having a frequency that is a multiple of a reference frequency. In a typical prior art circuit shown in FIG. 1 which is reproduced from FIG. 1 of U.S. Pat. No. 3,217,267, the operation of the frequency synthesizer is controlled by a phase lock loop (PLL) in which a variable frequency oscillator 2 is locked to the frequency of a known reference frequency 8 by a phase discriminator 6. In such arrangement, the oscillator typically is a voltage controlled oscillator (VCO) and the phase discriminator generates an output voltage that is proportional to the phase difference between the known reference frequency and the output of the oscillator. The output voltage of the phase discriminator is applied as an error signal to control the output frequency of the VCO.

Figure 1:
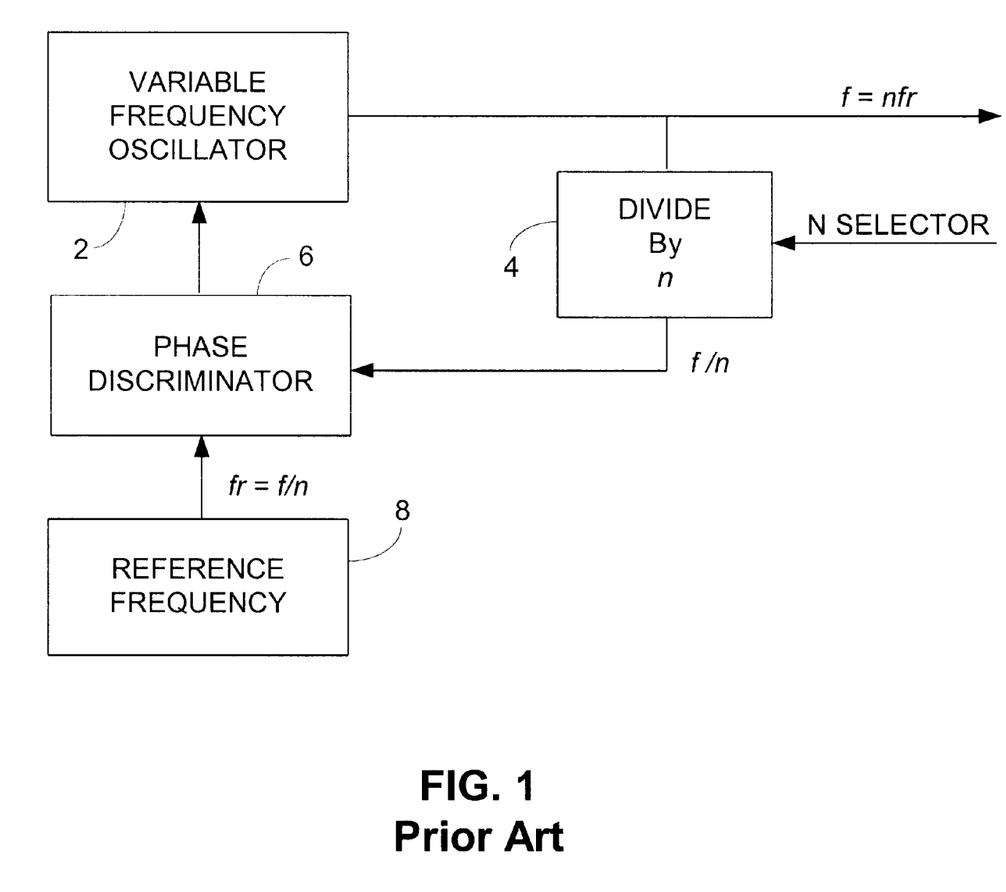
FIG. 1 is a block diagram of a prior art frequency synthesizer circuit.

To provide for different output frequencies from the VCO, a variable frequency divisor 4 is used to divide the output frequency before it is compared with the reference frequency. As a result, the output frequency from the VCO is an exact multiple of the reference frequency; and, if the divisor is an integer, the smallest increment in the VCO output frequency is equal to the reference frequency. Thus, to provide a small step size between adjacent output frequencies when using an integer divisor, a very low reference frequency is required. A low reference frequency, however, introduces a variety of unacceptable effects.

Figure 2:
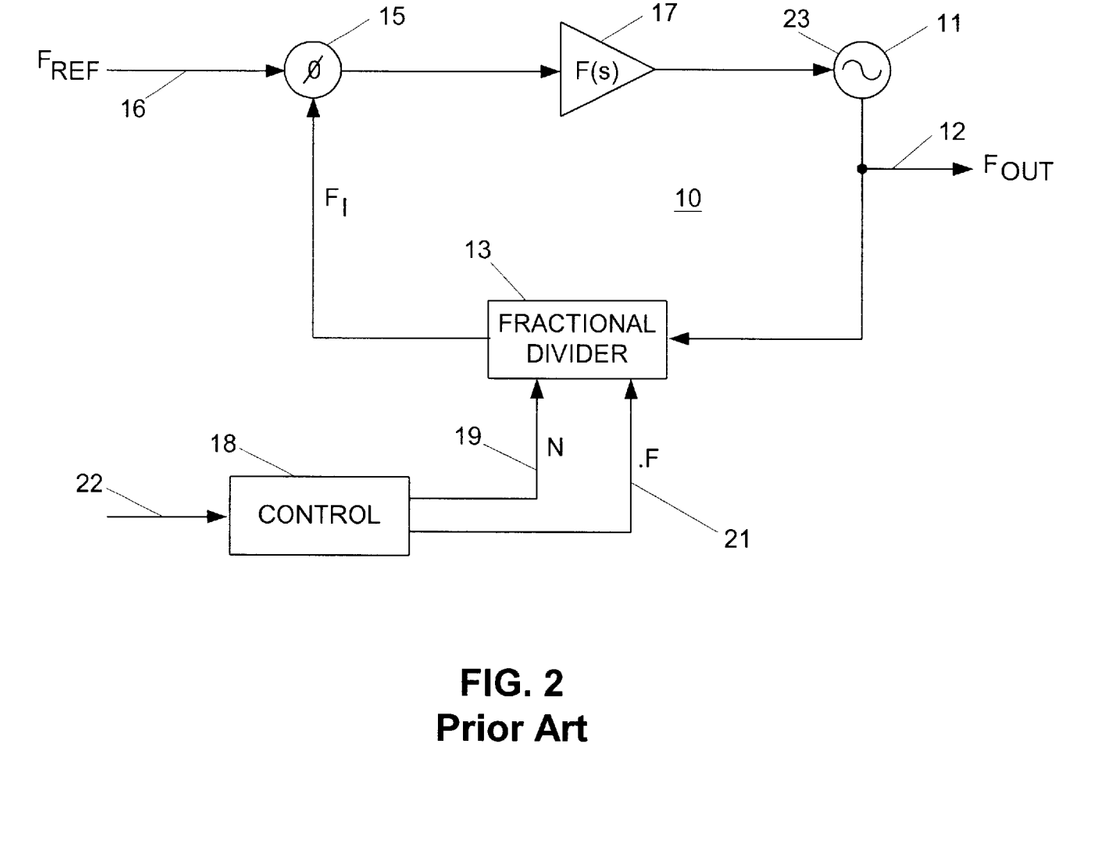
FIG. 2 is a block diagram of a prior art fractional-N divisor frequency synthesizer circuit.

To avoid the use of a low reference frequency, circuits have been devised for dividing the output frequency by a fractional number. The prior art circuit shown in FIG. 2 which is FIG. 1 of U.S. Pat. No. 5,038,117, comprises a voltage controlled oscillator 11, a fractional divider 13, a phase comparator 15 and a filter 17. A control circuit 18 controls the integer component N and the fractional component .F by which the output frequency is divided. As is known in the art, different techniques may be used to effect fractional N division. In one such technique, division by N.F is achieved by averaging the divisor such that the output frequency is divided by N for .F of a duty cycle and by N+1 for (1−.F) of the duty cycle.

Further details concerning such fractional-N frequency synthesizers may be found in U.S. Pat. Nos. 3,217,267 and 5,038,117, which are incorporated herein by reference.

Figure 3:
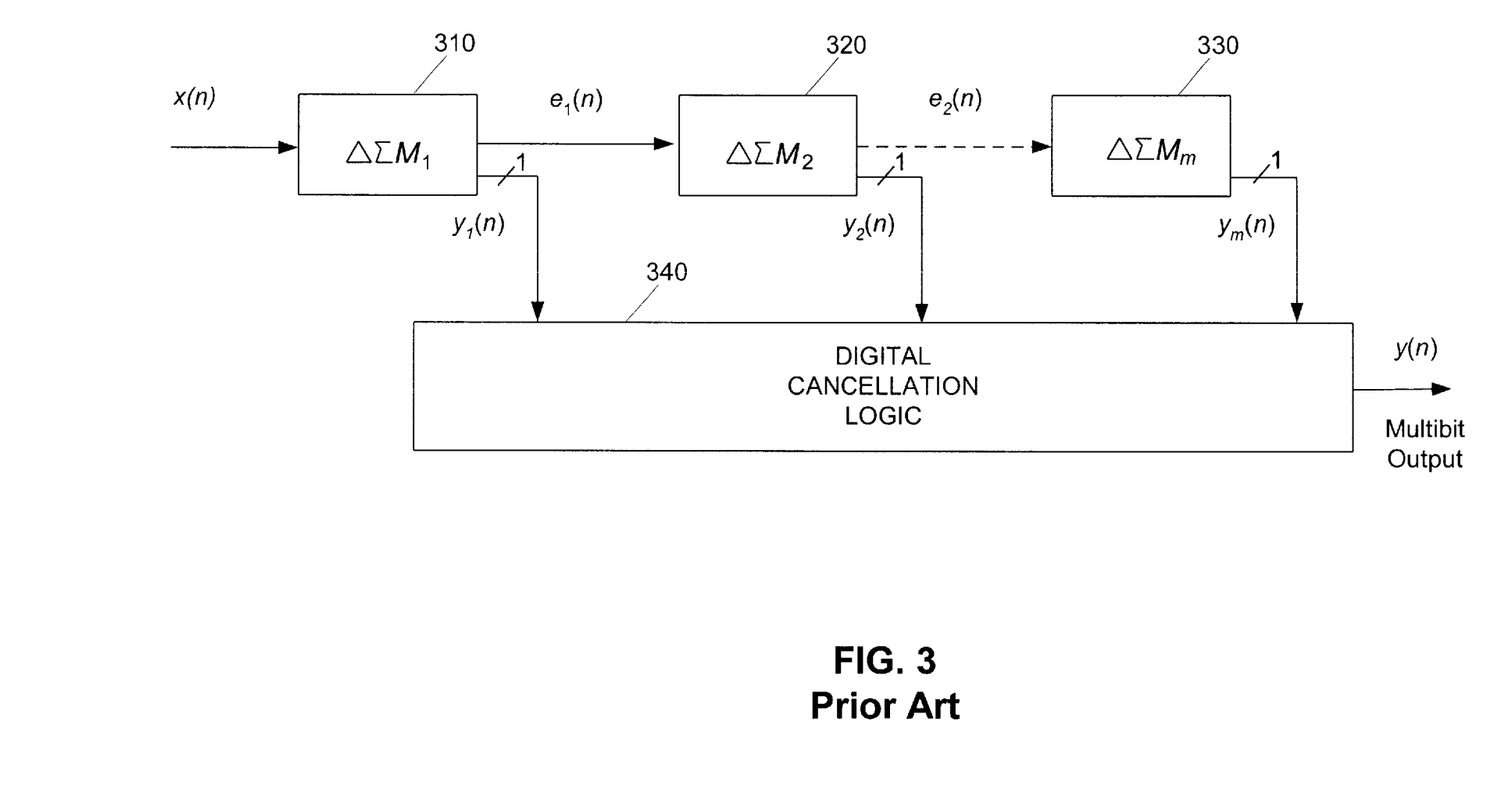
FIG. 3 is a block diagram of a prior art multistage Delta-Sigma modulator.
Figure 4:
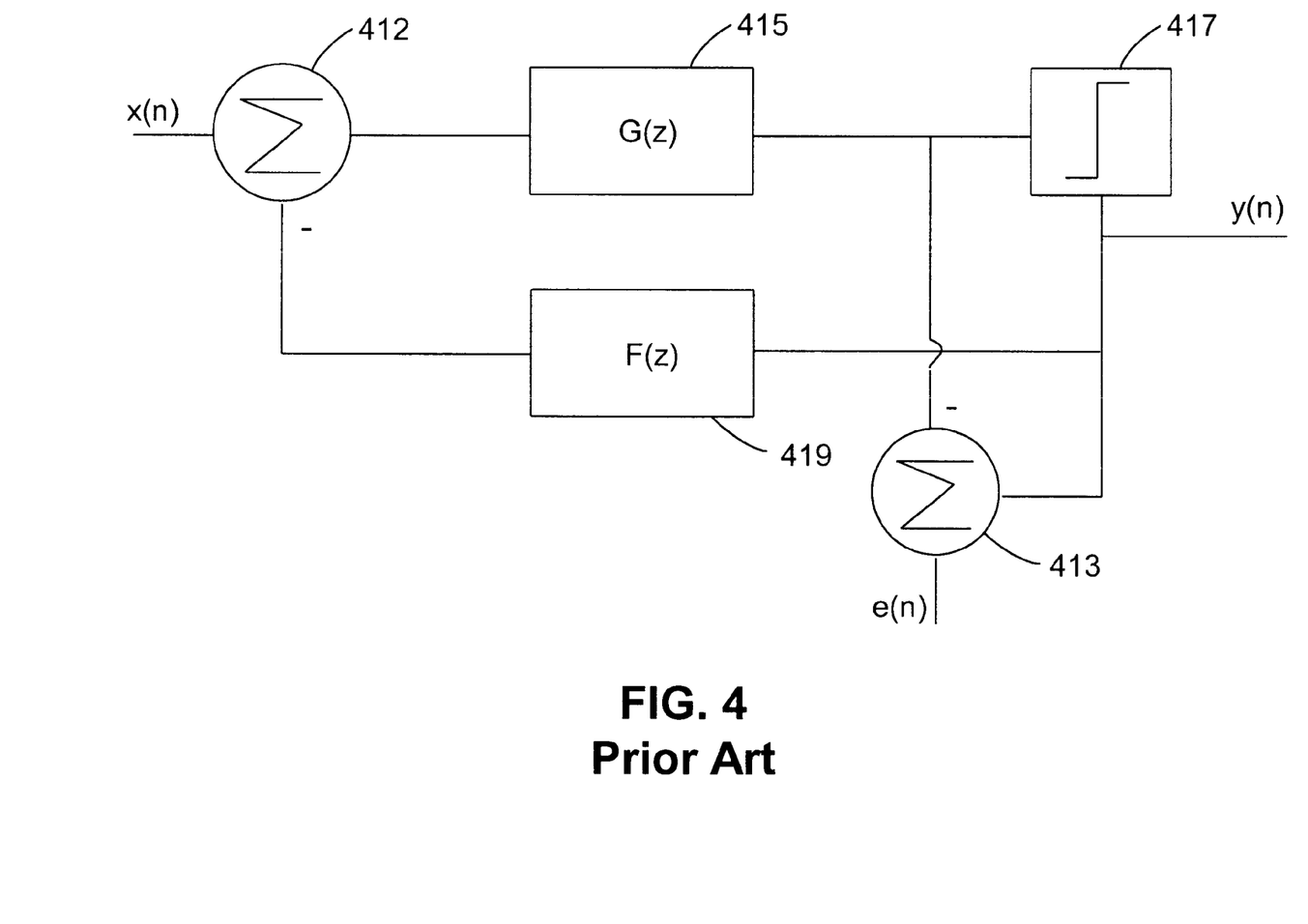
FIG. 4 is a block diagram of one stage of a prior art general Delta-Sigma modulator.

Unfortunately, switching between divisors results in an undesirable phase error or phase jitter near the carrier frequency. Techniques for reducing such phase error are also known and are described in U.S. Pat. No. 4,609,881 and in Steven R. Norsworthy et al. (Ed.) Delta-Sigma Data Converters Theory, Design, and Simulation, IEEE Press (1997), which are incorporated herein by reference, as well as in the above-referenced U.S. Pat. Nos. 3,217,267 and 5,038,117. As shown in FIG. 3 which is reproduced from FIG. 3.3 of Delta-Sigma Data Converters, a general technique for reducing such phase error is to cascade multiple stages of first or second order Delta-Sigma modulators 310, 320, 330 and supply an output of each stage to digital cancellation logic 340. The general form of each modular stage is shown in FIG. 4 which is adapted from FIG. 3.1 of Delta-Sigma Data Converters. As shown in FIG. 4, the modulator comprises first and second summers 412, 413, first and second filters 415, 419 and a quantizer 417. Filter 419 connects an output signal, y(n), from quantizer 417 to a negative input of first summer 412 which combines an input signal x(n) with the filtered output and provides the result to an input to filter 415. An output of filter 415 is provided to an input to quantizer 417. Second summer 413 calculates the difference between the signals at the input and the output of quantizer 417 to generate a signal, e(n), representing the quantization error of the quantizer. Ideally, for the circuit of FIG. 3 the noise transfer function is $(1-Z^{-1})^m$, where m is the overall order. Such a function has m coincident zeroes at z=1 in the Z-transform plane.

Figure 5:
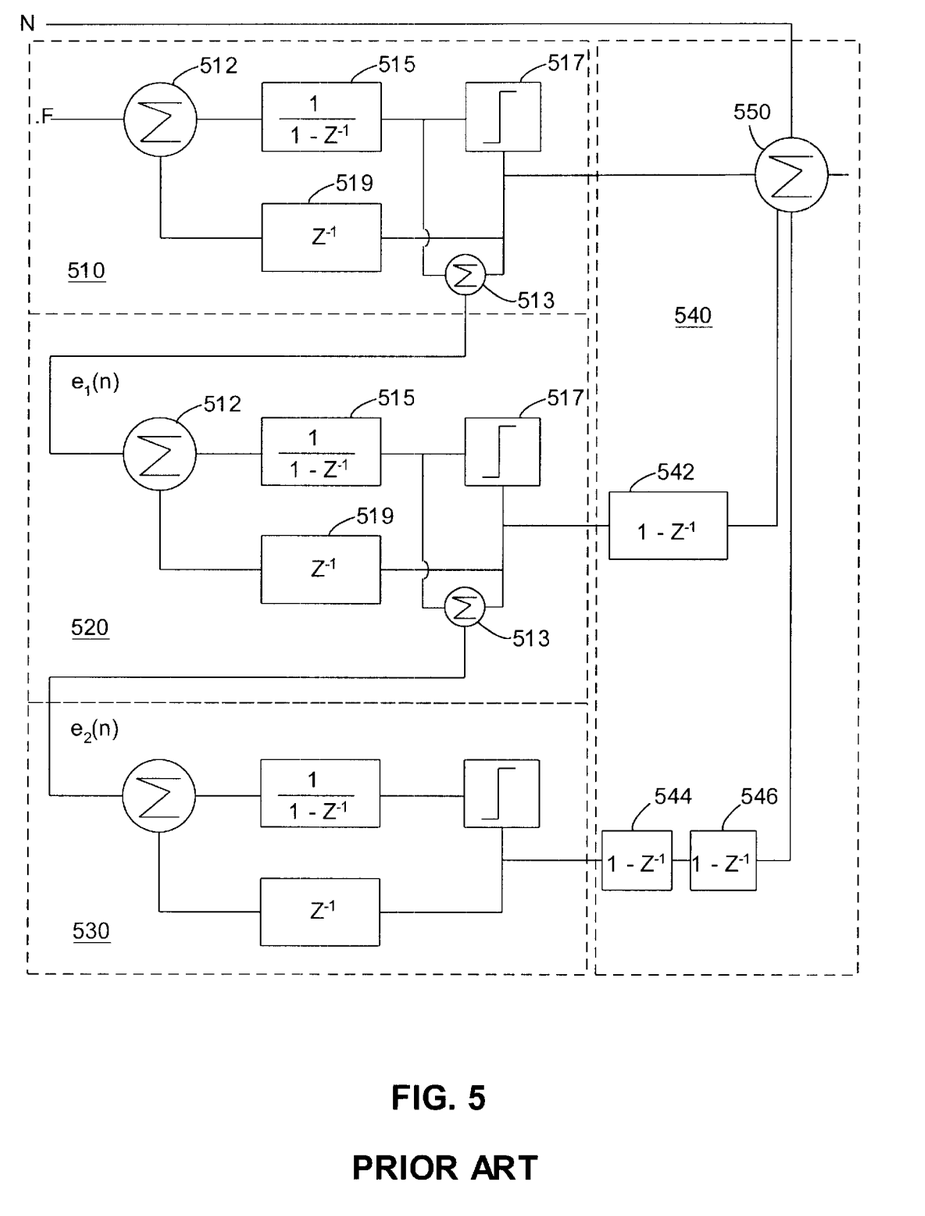
FIG. 5 is a block diagram of a prior art multistage modulator for use in fractional-N synthesis.

A model of the Delta-Sigma modulator of FIG. 3 is shown in FIG. 5 which is reproduced from FIG. 5(d) of the '117 patent. Here, each of three identical stages 510, 520, 530 comprises first and second summers 512, 513, an integrator 515, a quantizer 517 and a $Z^{-1}$ delay 519. A digital cancellation logic circuit 540 comprises a first differentiator 542 coupled to the output of the second stage 520, second and third differentiators 544, 546 coupled in cascade to the output of the third stage 530 and summer circuitry 550 coupled to the outputs of the first stage 510, the first differentiator 542 and the third differentiator 546. A series of error terms arising at different stages of the circuit of FIG. 5 are canceled when the terms are combined. In particular, following equation 16 of the '117 patent, the combined output of the circuit of FIG. 5 can be written $$O = f + (1-Z^{-1})Q_1 - (1-Z^{-1})Q_1 + (1-Z^{-1})^2 Q_2 - (1-Z^{-1})^2 Q_2 + (1-Z^{-1})^3 Q_3$$

where $Q_n$ is the quantization error associated with stage n. This equation reduces to $$O = f + (1-Z^{-1})^3 Q_3.$$

As will be recognized by those skilled in the art, this equation has three coincident zeroes at z=1 in the Z-transform plane.

Figure 6:
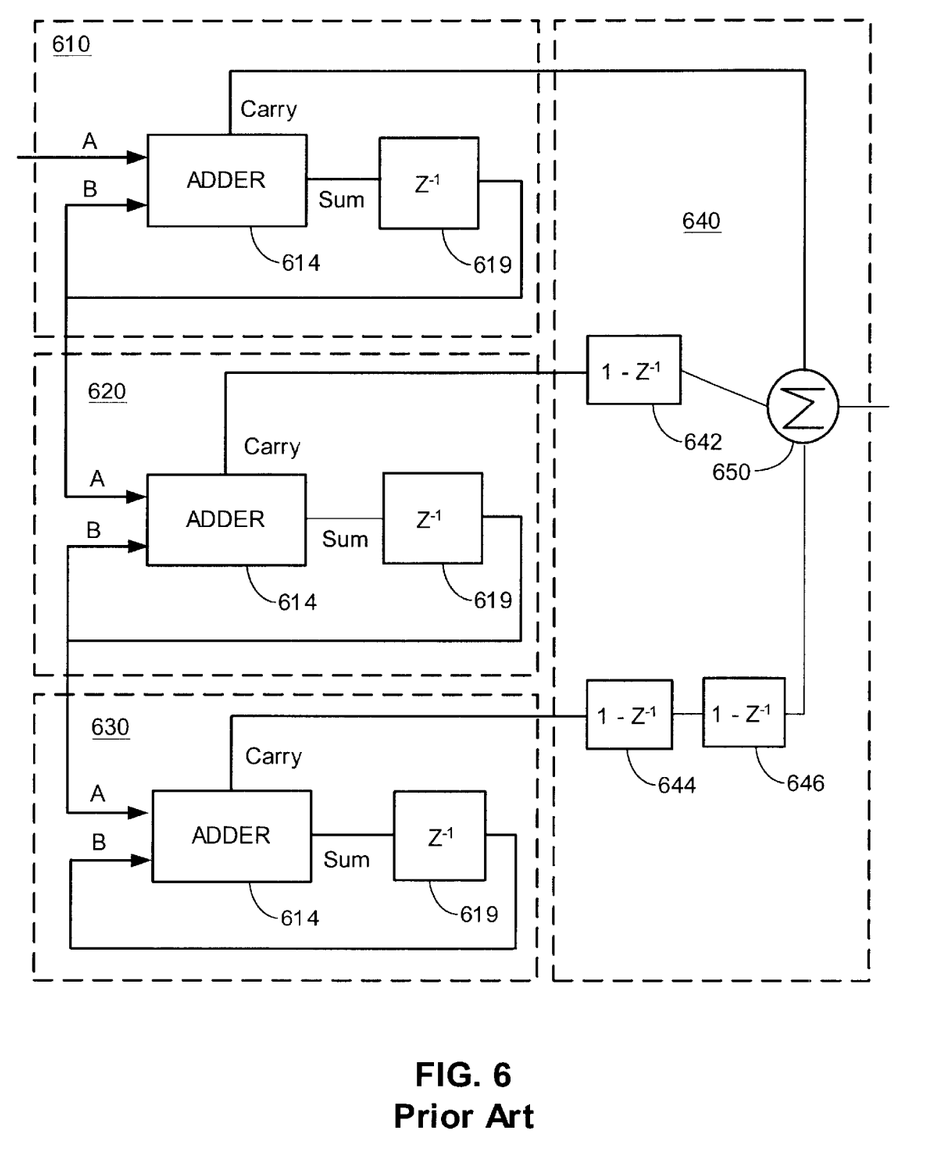
FIG. 6 is a block diagram of a prior art implementation of the modulator of FIG. 5.

An actual implementation of the Delta-Sigma modulator of FIG. 5 is shown in FIG. 6.

Here, each of three identical stages 610, 620, 630 comprise an adder 614 and a $Z^{-1}$ delay 619. A digital cancellation logic circuit 640 comprises a first differentiator 642, coupled to the carry output of adder 614 of the second stage 620, second and third differentiators 644, 646 coupled in cascade to the carry output of adder 614 of the third stage 630 and summer circuitry coupled to the carry output of the adder 614 of the first stage 610, the output of the first differentiator 642 and the output of the third differentiator 646.

SUMMARY OF THE INVENTION

While prior art circuits of the type shown in FIGS. 3, 5 and 6 have better performance than conventional fractional-N synthesizer circuits, there is still a need for even better performance.

We have devised such a circuit. With reference to the Z-transform plane, such better performance is achieved by separating the zeroes in the Z-transform plane. As a result, the spectrum of the noise components of the fractional-N divisor is shifted away from the carrier frequency, thereby reducing the components near the carrier frequency and increasing the components farther away. This is advantageous because it is possible to remove the higher frequency components from the divisor signal by conventional filtering techniques. The model of a circuit for separating the zeroes is similar to that of FIG. 4 and comprises a first summer, first and second filters and a quantizer. The second filter connects an output of the quantizer to the first summer and an output of the summer is connected to an input of the first filter and an output of the first filter is connected to an input to the quantizer. In accordance with the invention, the second filter introduces off-axis zeroes into equations representative of this circuit. In a preferred embodiment, the second filter is realized by first and second delay elements connected in cascade, a multiplier and a second summer. An input to the first delay element is connected to the output of the quantizer and an output of the second delay element is connected to an input to the second summer. An input to the multiplier is connected to a node between the first and second delay elements and an output of the multiplier is connected to an input to the second summer. The second summer subtracts the signal from the second delay element from the signal from the multiplier and provides it as an input to the first summer.

The invention may also be implemented in software to generate fractional N divisors having desirable spectral characteristics.

BRIEF DESCRIPTION OF THE DRAWINGS

These and other objects, features and advantages of the invention will be more readily apparent from the following detailed description of the invention in which.

DETAILED DESCRIPTION OF THE INVENTION

Figure 7:
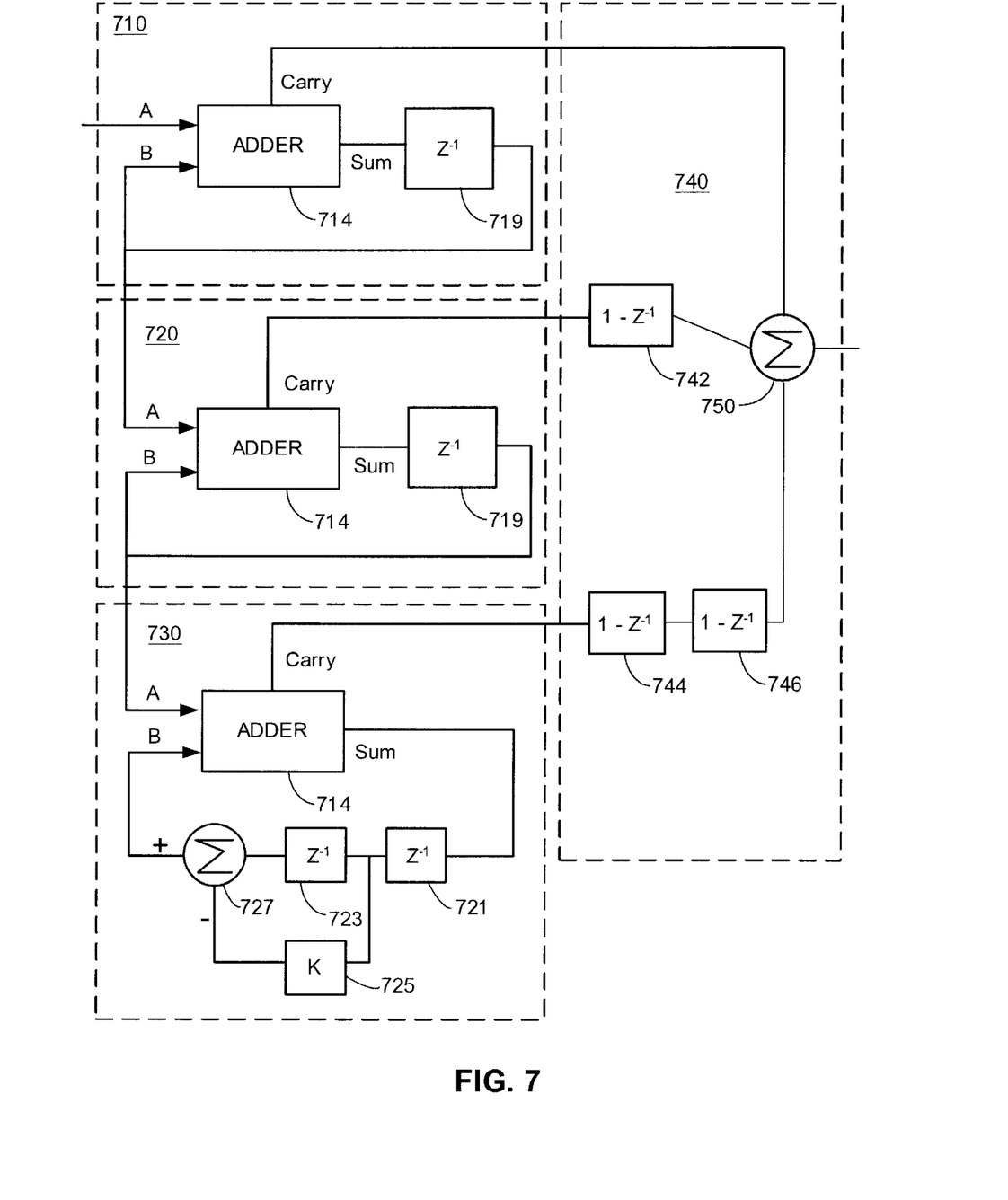
FIG. 7 is a block diagram of an illustrative embodiment of a multistage modulator of the present invention.

FIG. 7 is a block diagram of an illustrative embodiment of the invention. The circuit of FIG. 7 is a three stage modulator suitable for use in generating the divisor in a fractional N frequency synthesizer. Each stage comprises an adder 714 and one or more filter elements. In first and second stages 710, 720, the filter element is a $Z^{-1}$ delay element 719. In the third stage 730, the filter element comprises first and second delay elements 721, 723, connected in cascade, a multiplier 725 and a summer 727. An input to the first delay element 721 is connected to the output of the adder and an output of the second delay element 723 is connected to an input to the summer 727. An input to the multiplier 725 is connected to a node between the first and second delay elements 721, 723 and an output of the multiplier is connected to an input to the summer 727. The summer subtracts the signal from the second delay element 723 from the signal from the multiplier 725 and provides it as an input to the adder 714.

The output of summer 750 can be shown to be $$\text{Output} = f + (1-Z^{-1})Q_1 - (1-Z^{-1})Q_1 + (1-Z^{-1})^2 Q_2 - (1-Z^{-1})^2 Q_2 + (1-KZ^{-1}+Z^{-2})(1-Z^{-1})^2 Q_3 = f + (1-Z^{-1})^2(1-KZ^{-1}+Z^{-2})Q_3.$$

Thus, the circuit of FIG. 7 achieves the same advantages of the circuit of FIGS. 5 and 6 in cancelling intermediate terms and has the added advantage that the zeroes of the term $(1-KZ^{-1}+Z^{-2})$ are not on the abscissa for the case where K<2.

Figure 8:
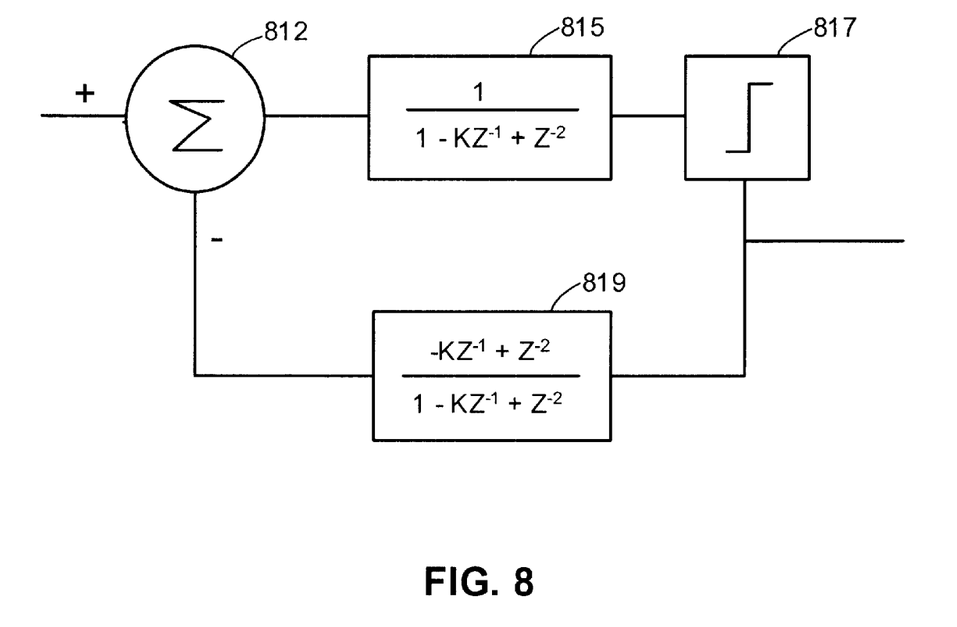
FIG. 8 is a block diagram of an illustrative model of one stage of a modulator of the present invention.

A model of the third stage 730 is shown in FIG. 8. The model comprises summer 812, first and second filters 815, 819 and a quantizer 817. The second filter connects an output of the quantizer to the summer and an output of the summer is connected to an input of the first filter and an output of the first filter is connected to an input to the quantizer. In accordance with the invention, the second filter introduces off-axis zeroes into equations representative of this circuit.

Filter 819 introduces the polynomial term $(1-KZ^{-1}+Z^{-2})$ into the z-transform equation representative of the circuit of FIG. 7. The roots or zeroes of this term are $$\frac{K \pm \sqrt{K^2-4}}{2}.$$

For values of K<2, this term introduces into the equation a pair of non-coincident zeroes on opposite sides of the abscissa.

Figure 9:
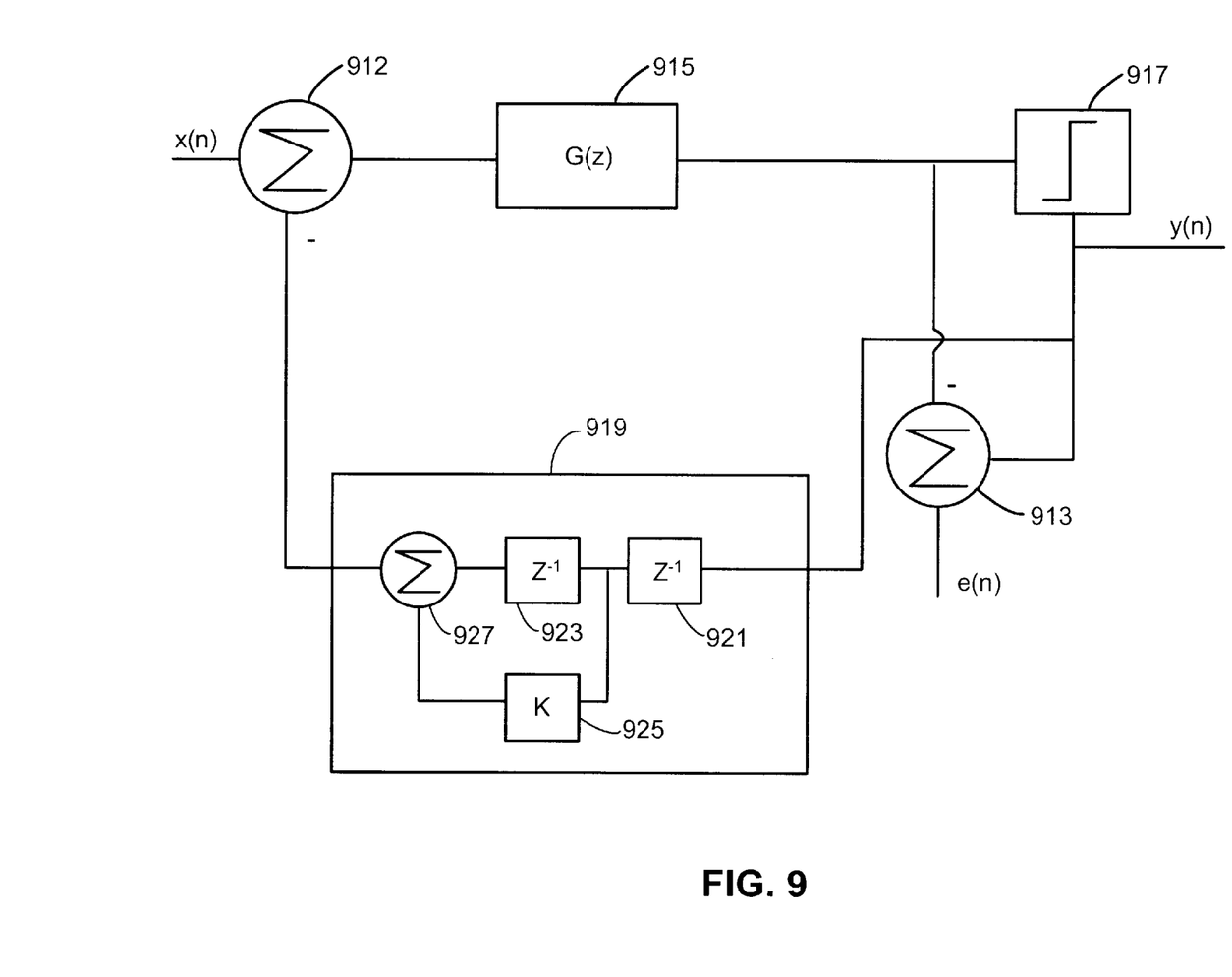
FIG. 9 is a detailed block diagram of an illustrative model of one stage of a modulator of the present invention.

As shown in FIG. 9, the model of a circuit for separating the zeroes is similar to that of FIG. 4 and comprises a first summer 912, first and second filters 915, 919 and a quantizer 917. The second filter connects an output of the quantizer 917 to the first summer 912 and an output of the summer 912 is connected to an input of the first filter 915 and an output of the first filter 915 is connected to an input to the quantizer 917. In accordance with the invention, the second filter introduces off-axis zeroes into equations representative of this circuit. In a preferred embodiment, the second filter is realized by first and second delay elements 921, 923 connected in cascade, a multiplier 925 and a second summer 927. An input to the first delay element 921 is connected to the output of the quantizer 917 and an output of the second delay element 923 is connected to an input to the second summer 927. An input to the multiplier 925 is connected to a node between the first and second delay elements 921, 923 and an output of the multiplier is connected to an input to the second summer 927. The second summer 927 subtracts the signal from the second delay element 923 from the signal from the multiplier 925 and provides it as an input to the first summer 912.

What is claimed is:

1. In a fractional N frequency synthesizer, a circuit comprising:

first, second and third stages connected in cascade, a digital cancellation logic circuit comprising a first differentiator having an input connected to an output of the second stage, second and third differentiators connected in cascade with the second differentiator having an input connected to an output of the third stage and summer circuitry having inputs connected to the output of the first stage, an output of the first differentiator and an output of the third differentiator;

each of said first and second stages functioning as a Sigma-Delta modulator;

said third stage comprising an adder, a summer and a delay circuit, an input of the delay circuit being connected to an output of the adder, said delay circuit having a plurality of outputs that are combined by said summer to form a summer output signal that is provided as an input to the adder, said delay circuit introducing at least one off-axis zero into an equation representative of said circuit.

2. In a fractional N frequency synthesizer, a circuit model comprising:

a first summer;

first and second filters, and a quantizer, an output of the first summer being connected to an input to the first filter and an output of the first filter being connected to an input to the quantizer, an output of the quantizer being connected to the second filter and an output of the second filter being connected to an input to the summer;

where the second filter introduces at least one off-axis zero into an equation representative of said circuit.

3. The circuit model of claim 2 wherein the second filter comprises first and second circuit elements having inputs coupled to the output of the quantizer and outputs coupled to an input to a second summer and an output of said second summer is connected to an input to said first summer.

4. In a fractional N frequency synthesizer, a circuit model comprising:

at least first and second modulator stages connected in cascade, each comprising:

a first summer;

first and second filters, and a quantizer, an output of the first summer being connected to an input to the first filter and an output of the first filter being connected to an input to the quantizer, an output of the quantizer being connected to the second filter and an output of the second filter being connected to an input to the summer;

where the second filter in at least one stage introduces at least one off-axis zero into an equation representative of said circuit.

5. The circuit model of claim 4 wherein the second filter in at least one stage comprises first and second circuit elements having inputs coupled to the output of the quantizer in that stage and outputs coupled to an input to a second summer and an output of said second summer is connected to an input to said first summer in that stage.

6. In a fractional N frequency synthesizer, a circuit model comprising:

a least first, second, and third modulator stages connected in cascade, each comprising a first summer, first and second filters and a quantizer, an input of the second filter being connected to an output of the quantizer and an output of the second filter being connected to a negative input of the first summer, an output of the first summer being connected to an input to the first filter and an output of the first filter being connected to an input to the quantizer;

a digital cancellation logic circuit comprising a first differentiator having an input connected to the output of the second modulator stage, second and third differentiators connected in cascade with the second differentiator having an input connected to the output of the third modulator stage and summer circuitry having inputs connected to the output of the first modulator stage, an output of the first differentiator and an output of the third differentiator; and a circuit in at least one modulator stage for introducing at least one off-axis zero into an equation representative of said circuit.

7. The circuit model of claim 6 further comprising in said first and second stages a second summer connected to said quantizer so as to generate a quantization error signal that is supplied as an input to the first summer of the next stage.

8. The circuit model of claim 6 wherein the first filter is an integrator.

9. The circuit model of claim 6 wherein the second filter includes at least one delay element.

10. In a fractional N frequency synthesizer, apparatus comprising:

a first stage comprising a first adder and a first delay circuit, an input of the first delay circuit being connected to an output of the first adder and an output of the first delay circuit being connected to an input of the first adder;

a second stage comprising a second adder and a second delay circuit, an input of the second delay circuit being connected to an output of the second adder and an output of the second delay circuit being connected to a first input of the second adder, an output of the first delay circuit of the first circuit being connected to a second input of the second adder;

a third stage comprising a third adder and a third delay circuit, an input of the third delay circuit being connected to an output of the third adder and an output of the third delay circuit being connected to a first input of the third adder, an output of the second delay circuit of the second circuit being connected to a second input of the third adder;

a digital cancellation logic circuit comprising a first differentiator having an input connected to a carry output of the second adder of the second circuit, second and third differentiators connected in cascade with the second differentiator having an input connected to a carry output of the third adder of the third circuit and summer circuitry having inputs connected to a carry output of the first adder of the first circuit, an output of the first differentiator and an output of the third differentiator; and a circuit in at least one of said first, second and third stages for introducing at least one off-axis zero into an equation representative of said apparatus.

11. The apparatus of claim 10 wherein the circuit for introducing at least one off-axis zero comprises first and second delay elements connected in cascade, an input of the first delay element being connected to an output of the adder in that stage and at least one multiplier or additional delay element connected to a node between the first and second delay elements, outputs of said second delay element and said multiplier or additional delay element being connected to a summer the output of which is connected to a second input to the adder of that stage.

* * * * *